(12) United States Patent  
Pagel et al.

(10) Patent No.: US 6,598,765 B2  
(45) Date of Patent: Jul. 29, 2003

(54) DISPOSABLE SYRINGE DISPENSER SYSTEM

(75) Inventors: Russell T. Pagel, Rolla, MO (US); Jeremy W. McCutcheon, Rolla, MO (US); Jeffrey L. Kohne, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 09/928,543

(22) Filed: Aug. 13, 2001

(65) Prior Publication Data

US 2002/0043539 A1 Apr. 18, 2002

Related U.S. Application Data

(63) Continuation-in-part of application No. 09/607,310, filed on Jun. 30, 2000, now abandoned.

(51) Int. Cl.[7] ................................................. B65D 37/00
(52) U.S. Cl. .................... 222/214; 222/207; 222/181.3; 222/571; 222/387; 222/389; 222/60; 222/399; 222/494
(58) Field of Search ................................. 222/207, 214, 222/181.2, 181.3, 571, 153.01, 387, 389, 504; 60/399, 494

(56) References Cited

U.S. PATENT DOCUMENTS

| | | | |
|---|---|---|---|
| 1,098,514 A | * | 6/1914 | Maddox .................... 222/214 |
| 3,982,724 A | | 9/1976 | Citrin |
| 4,030,640 A | | 6/1977 | Citrin et al. |
| 4,715,517 A | | 12/1987 | Potter et al. |
| 4,921,133 A | | 5/1990 | Roeser |
| 4,961,508 A | | 10/1990 | Weimer et al. |
| 5,033,656 A | | 7/1991 | Blette et al. |
| 5,035,350 A | | 7/1991 | Blette et al. |
| 6,024,257 A | | 2/2000 | Djavit |

* cited by examiner

Primary Examiner—David A. Scherbel  
Assistant Examiner—Stephanie L. Willatt  
(74) Attorney, Agent, or Firm—Hovey Williams LLP

(57) ABSTRACT

A dispenser (10) for flowable, viscous material (52) includes a housing (12) comprising a main body (18) and door (20), and a reservoir (50) for the material (52) with an elongated, synthetic resin deformable outlet tube (80) presenting an outlet end (82) coupled to the reservoir (50). A flow-controlling assembly (16) including a tube-engaging element (84, 132, 150, 158) and an actuator linkage assembly (86, 130, 144, 154); these components together with a pneumatically operated piston (54) within reservoir (50) allows precise on-off operation of the dispenser (10). In the flow-permitting position, the element (84, 132, 150, 158) is adjacent the tube (80). When it is desired to terminate material flow, the actuator linkage assembly (86, 130, 144, 154) is operated to cause the element (84, 132, 150, 158) to move into deforming engagement with the tube (80) against a backing surface (41); continued movement of the element (84, 132, 150, 158) along the length of the tube (80) in a direction away from outlet end (82) generates a suction force causing material (52) adjacent the end (82) to be drawn into the confines of the tube (80), preventing air-drying of material (52) at end (82).

50 Claims, 8 Drawing Sheets

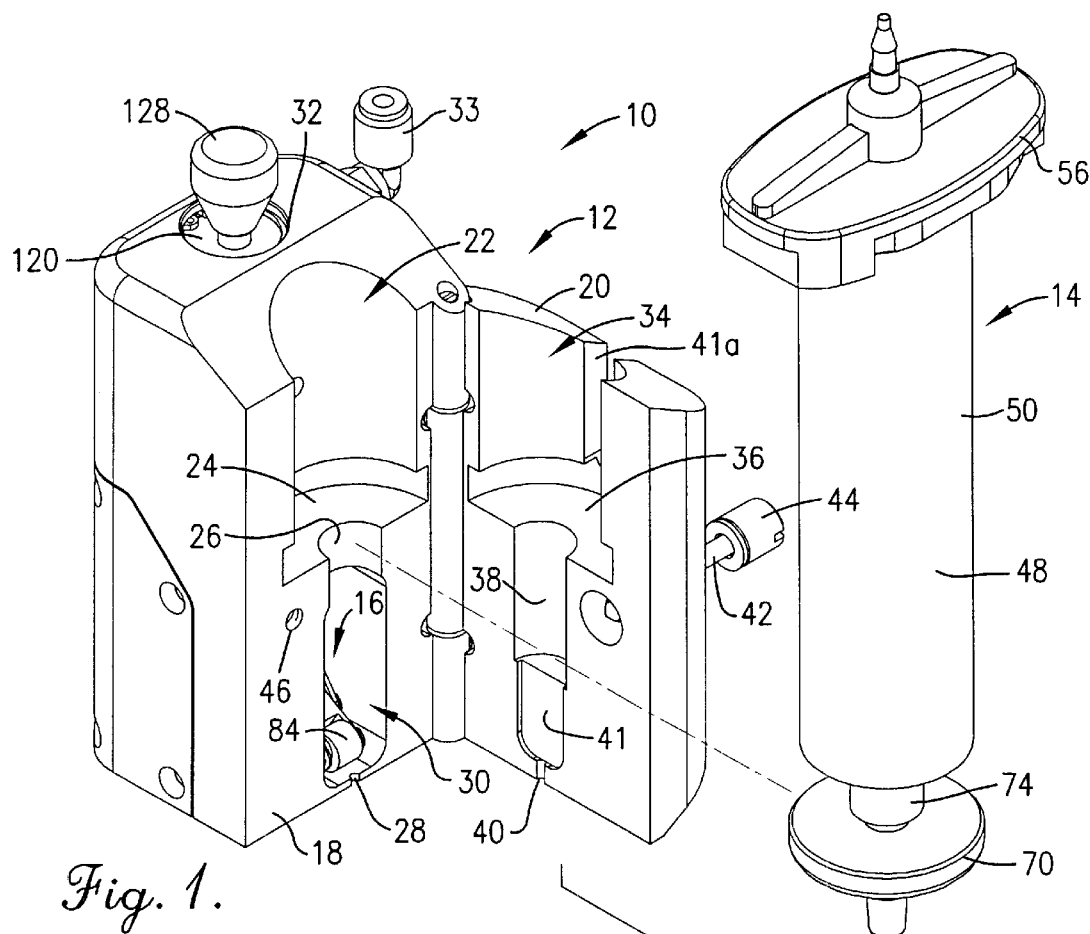

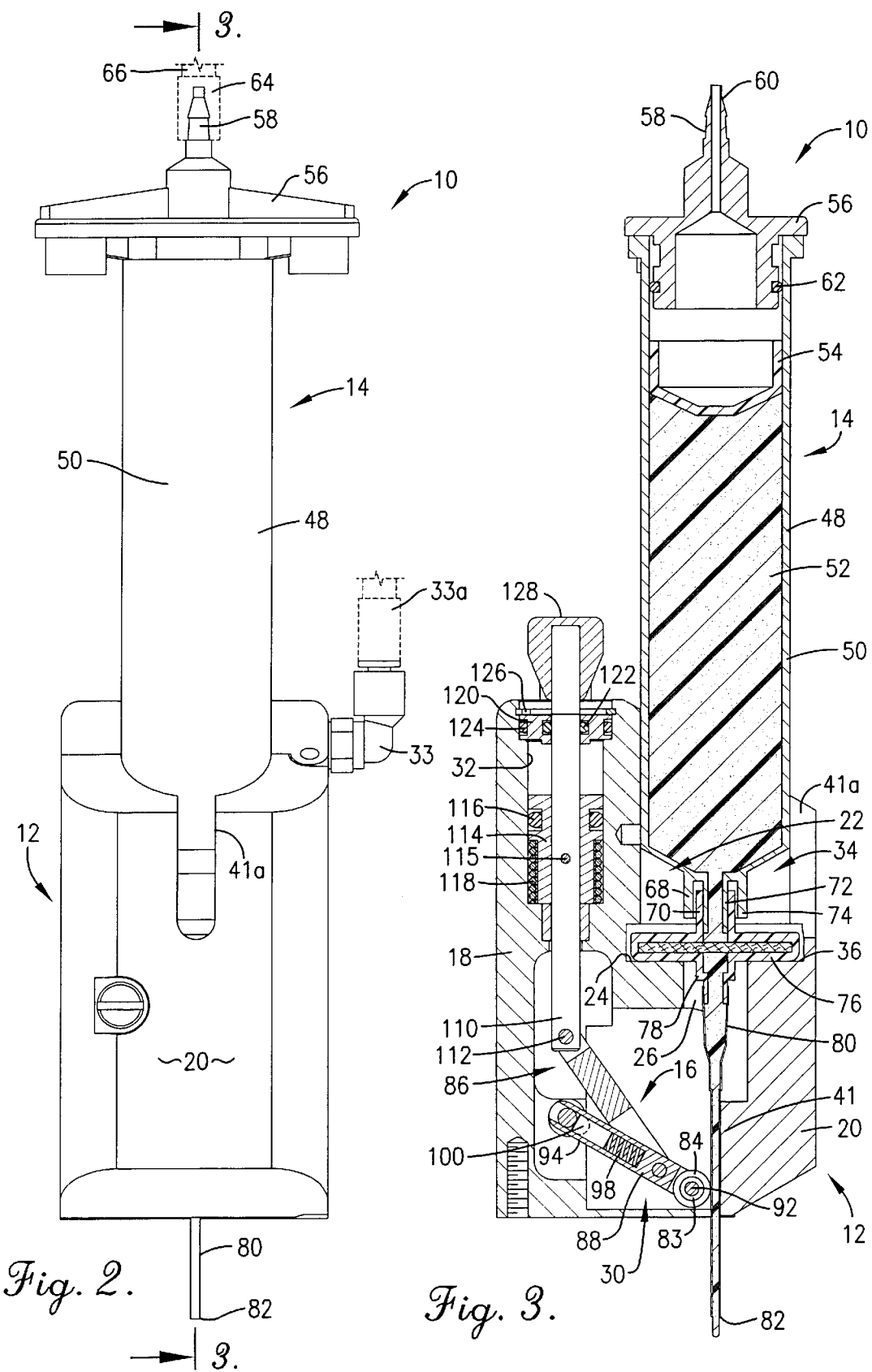

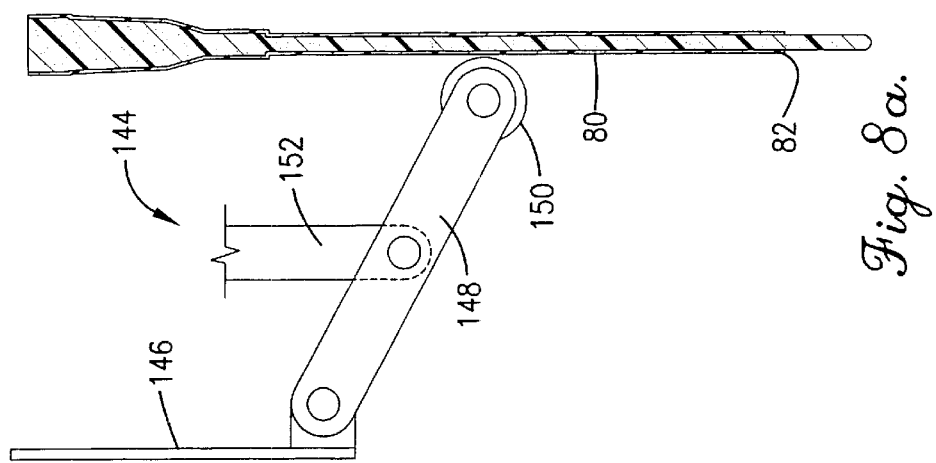
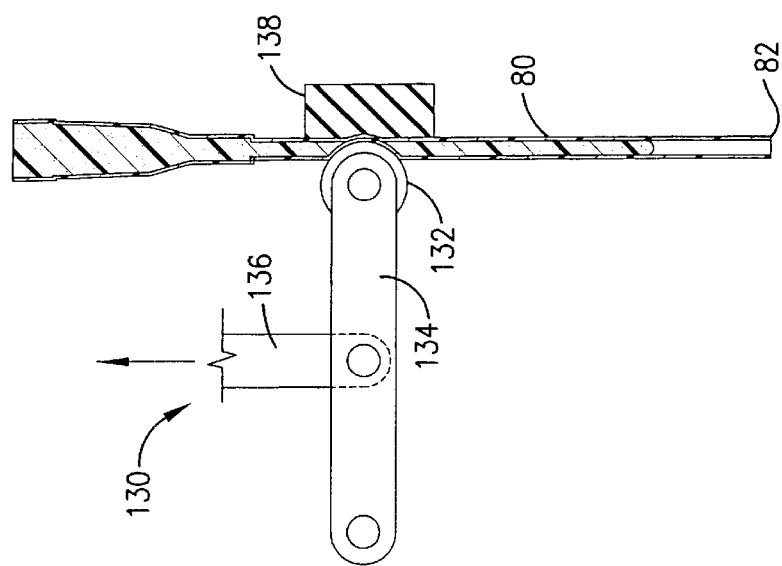
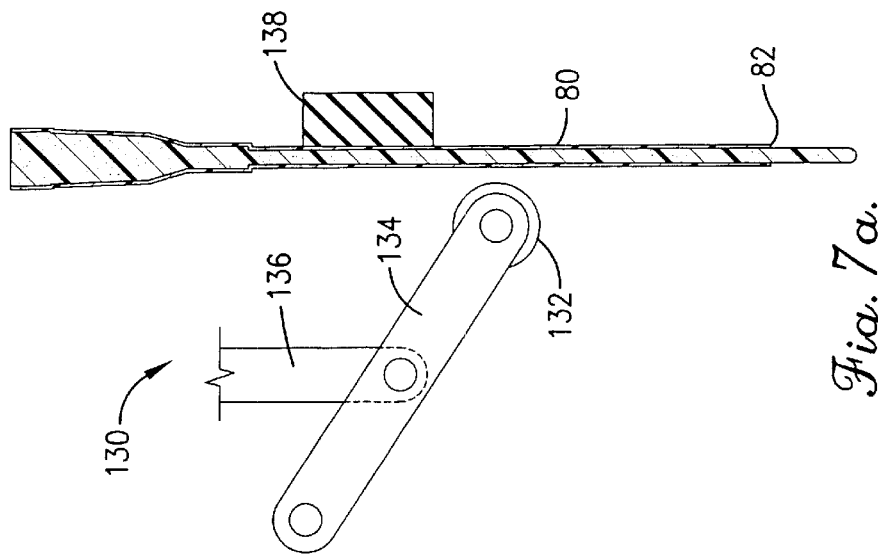

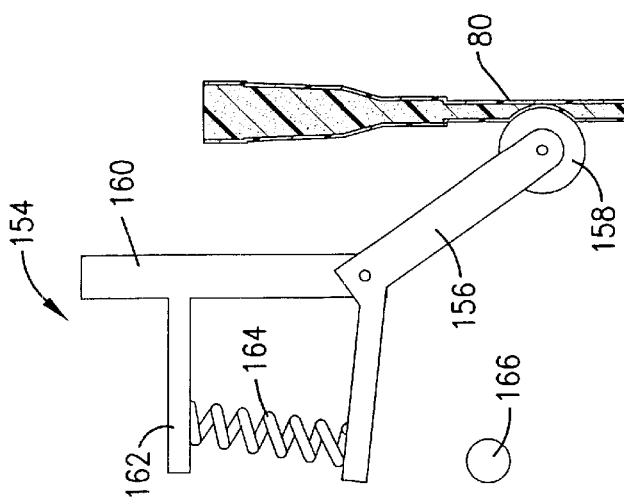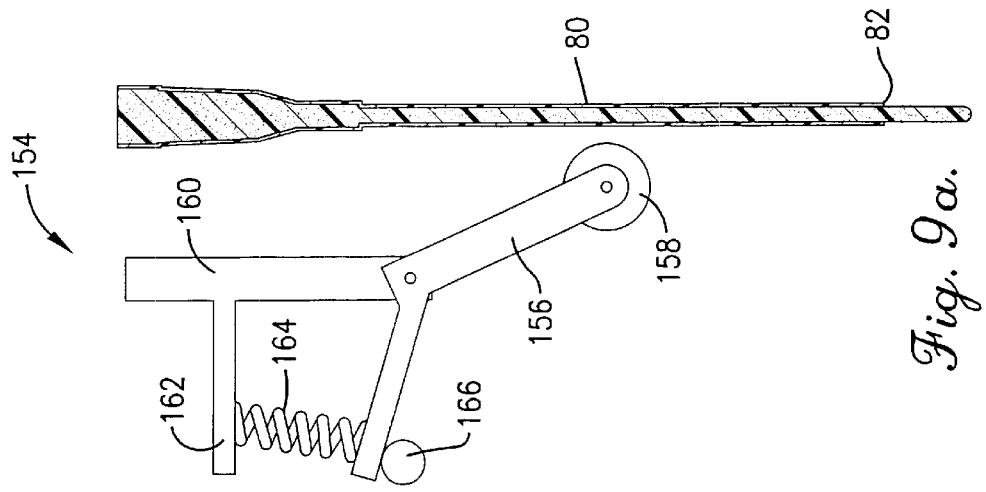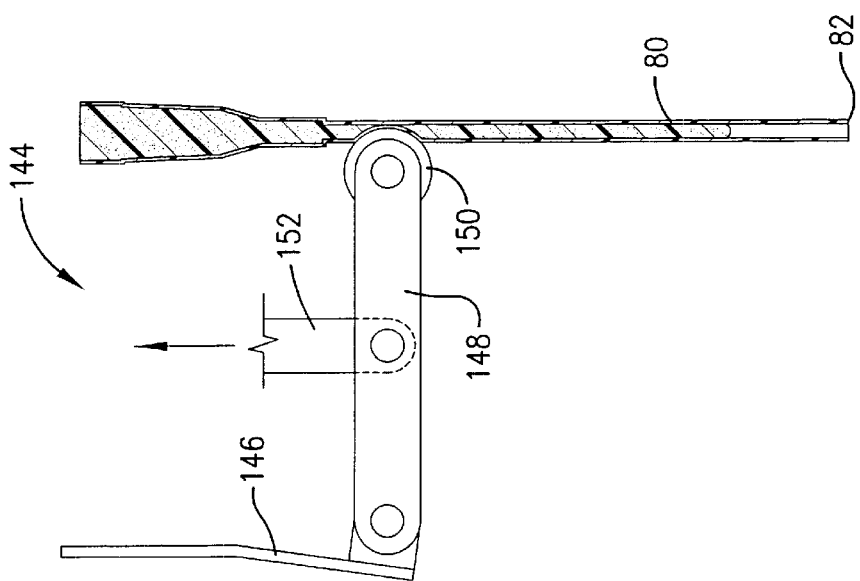

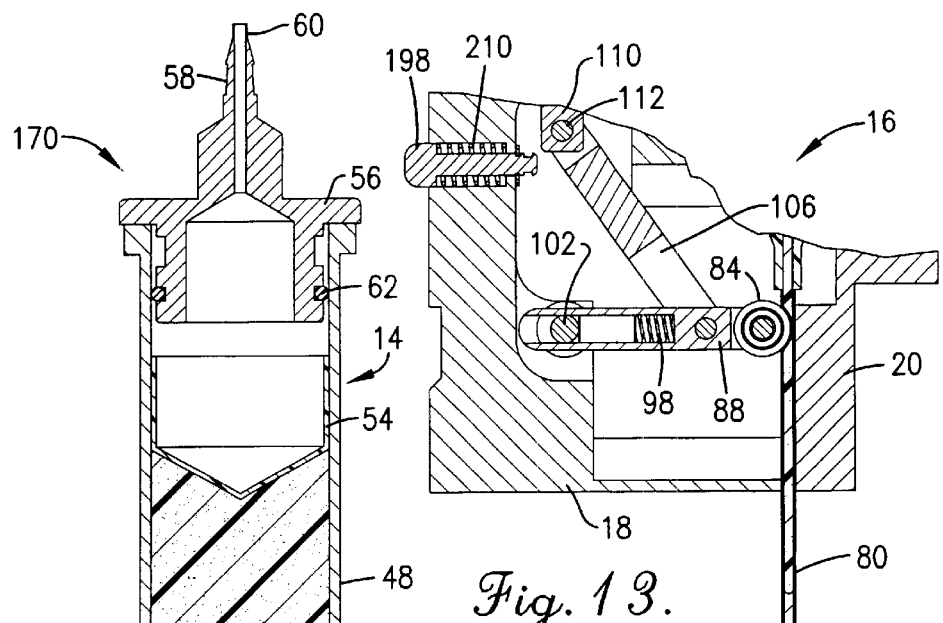

DISPOSABLE SYRINGE DISPENSER SYSTEM

RELATED APPLICATION

This is a continuation-in-part of Ser. No. 09/607,310, filed Jun. 30, 2000 now abandoned.

BACKGROUND OF THE INVENTION

1. Field of the Invention

The present invention is broadly concerned with dispenser devices and methods for precisely dispensing viscous, flowable materials. More particularly, the invention pertains to embodiments of such inventions and methods wherein accurate quantities of material can be repeatedly dispensed while minimizing the possibility of air drying of the material adjacent the dispenser outlet. In preferred practice the dispensers of the invention include a deformable outlet tube with a flow controlling assembly comprising a tube-engaging element (e.g., a roller) supported by an actuator linkage so as to selectively move the element to deform the outlet tube with continued movement of the element serving to generate a suction force adjacent the tube outlet end so that the flowable material at the end is drawn into the confines of the tube.

2. Description of the Prior Art

In the manufacture of integrated circuits, materials such as photo sensitive resins (photoresists) are applied to wafers, and the wafers are spun to evenly distribute the materials. Most photoresists and related materials are extremely expensive, and therefore care must be taken to use only the minimum amount of the composition necessary to accomplish the desired end. In practice, computer controlled syringe-type dispensers have been used to dispense materials of this character. These dispensers include a replaceable syringe supported on an actuator housing, with the syringe including a material reservoir and an elongated deformable outlet tube. Various types of controllers are used to selectively pinch off the outlet tube to terminate material flow from the syringe.

For example, U.S. Pat. Nos. 4,030,640, 3,982,724 and 5,033,656 describe various dispensers which include pinch-type flow controllers. The '724 patent makes use of a micrometer stop which is used to pinch off a deformable outlet tube. Similarly, the '640 patent employs a conical pinch element for this purpose. The '656 patent makes use of a pair of pinch elements.

However, the viscous nature of many materials, and particularly those used in the electronics industry, often cause a terminal droplet to form at the outlet end of material dispensing tubes. As a consequence, the material may dry at the end of the tube, requiring cleaning which can waste the materials, thus making simple pinch-type dispensers unsuitable.

In addition, commercial systems are available which use a mechanical apparatus to control the plunger of delivery syringes. However, these devices are large and somewhat expensive, and generally require the use of additional fluid tubing to connect the dispenser apparatus to the point where fluid is to be dispensed. This can be a problem if dispensing operations are interrupted or terminated for significant periods of time, in that the material may tend to dry within the tubing. In addition, this causes extra waste of materials in that the additional fluid tubing and associated fittings must be filled with fluid before use.

Pneumatic point-of-use syringe systems also exist that employ various methods of control of the pressure or vacuum in the syringe barrel to control the dispensing cycle. When used with materials that flow (as opposed to pastes) the materials are prevented from dripping by the application of a vacuum to the upper part of the syringe barrel. The level of vacuum must be high enough to prevent dripping yet not high enough to pull air through the dispenser tip and into the syringe barrel. Unfortunately, the level of vacuum required varies with the characteristics of the fluid and dispenser tip, as well as the amount of fluid remaining in the syringe barrel.

SUMMARY OF THE INVENTION

The present invention provides an improved dispenser for viscous flowable materials of compact, simplified design which overcomes many of the problems with prior art dispensers. To this end, the dispensers of the invention include a reservoir for holding materials to be dispensed, with a deformable outlet tube coupled with the reservoir and presenting an outlet end. A flow controlling assembly including a tube-engaging pinch element and an actuator are used to selectively move the element between a flow-permitting position adjacent the tube and a flow-blocking, tube-deforming engagement with the tube. To this end, the pinch element operates against an opposed backing surface, i.e., the outlet tube is disposed between the pinch element and backing surface. Furthermore, and very importantly, the element is moved by the actuator along the tube in a direction away from the outlet end in order to create a suction which draws material at the outlet end into the tube. This effectively eliminates problems associated with dripping and/or drying of material at the outlet end of the tube.

In preferred forms, the dispenser of the invention includes a small, upright housing adapted to receive a standard, removable dispenser syringe. The housing is configured to accept the syringe body with the filtered depending syringe outlet tube extending below the housing. A flow controlling assembly is located within the housing and includes a roller or similar tube-engaging element together with an actuary linkage assembly which may be pneumatically or mechanically operated. Advantageously, the roller is moved through an arcuate path to first engage the outlet tube and then moved upwardly along the length thereof to create the desirable suction at the end of the outlet tube. In order to achieve the best and most accurate flow control, the pinch closure effected between the pinch element and backing surface is resilient and biased. Such maybe obtained by a resilient bias associated with either the pinch element or the backing surface.

In further preferred forms, the dispenser has a bypass assembly which terminates delivery of pressurized air to the dispenser syringe, thereby preventing inadvertent dispensing of material. Additionally, a flow control valve may be provided which includes a selectively adjustable metering valve allowing the user to adjust the speed of operation of the flow-controlling assembly during movement thereof from the flow-permitting to the flow-blocking position thereof.

BRIEF DESCRIPTION OF THE DRAWINGS

FIG. 1 is a perspective, exploded view of the preferred dispenser housing, with a replaceable syringe assembly normally fitted within and supported by the housing;

FIG. 2 is a front view of the preferred dispenser of the invention, with a syringe mounted therein;

FIG. 3 is a vertical sectional view taken along the line 3—3 of FIG. 2 and depicting the dispenser in its open, flow-permitting position;

FIG. 6 is an enlarged, fragmentary, exploded perspective view of the components of the preferred flow-controlling assembly of the dispenser;

FIG. 7a is an essentially schematic side view of an alternate flow-controlling assembly making use of a mechanical linkage and an associated resilient bearing block, and shown with the assembly in its open, flow-permitting position;

FIG. 7b is a view similar to that of FIG. 7a, but illustrating the flow-controlling assembly in its alternate flow-blocking position;

FIG. 8a is an essentially schematic side view of another type of flow-controlling assembly, making use of a spring loaded mechanical linkage, and depicting the flow-controlling assembly in its open, flow-permitting position;

FIG. 8b is a view similar to that of FIG. 8a, but illustrating the flow-controlling assembly in its flow-blocking position;

FIG. 9a is an essentially schematic side view of a still further type of flow-controlling assembly, making use of a spring-biased dogleg linkage, and showing the assembly in its open position;

FIG. 9b is a view similar to that of FIG. 9a, but depicting the flow-controlling assembly in its closed flow-blocking position;

FIG. 12 is a vertical sectional view taken along line 12—12 of FIG. 11 and depicting the device in the flow-permitting position thereof;

FIG. 13 is an enlarged, fragmentary vertical sectional view of the FIG. 10 device, illustrating the flow-controlling assembly in its flow-blocking position;

FIG. 14 is an enlarged, fragmentary vertical sectional view similar to FIG. 13, but illustrating the flow controlling assembly in its locked, flow-permitting position; and FIG. 15 is a schematic drawing of the flow control valve.

DETAILED DESCRIPTION OF THE PREFERRED EMBODIMENTS

The Embodiments of FIGS. 1–9b

Figure 4:
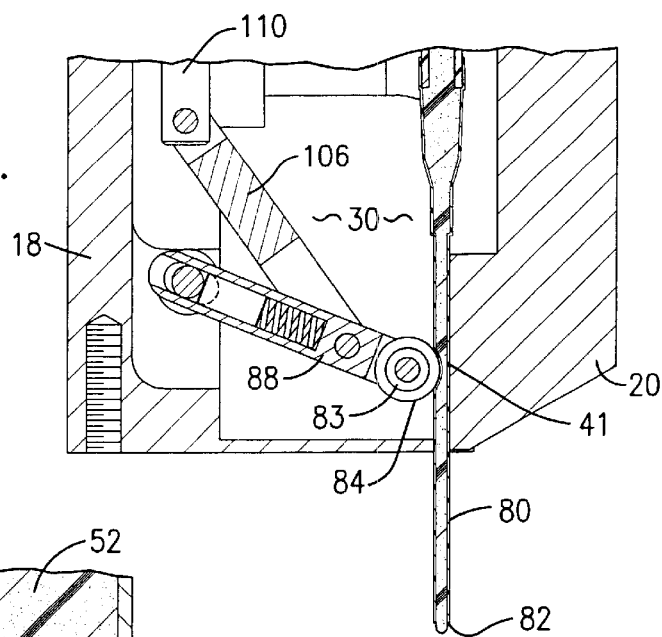
FIG. 4 is an enlarged, fragmentary vertical sectional view illustrating the dispenser of FIG. 2 during the initial stages of operation thereof to stop flow of material from the dispenser.

Turning now to the drawings, FIGS. 1–3 depict a preferred dispenser 10 in accordance with the invention. Broadly speaking, the dispenser 10 includes a housing 12, a replaceable reservoir 14, and a flow controlling assembly 16 supported within the housing 12 and operable to precisely control the flow of material from the reservoir 14.

In more detail, the housing 12 includes a main body 18 having a hingedly mounted door 20. The body 18 presents an upper, syringe-supporting recess 22 with a bottom shelf 24. In addition, the body has a semi-cylindrical opening 26 extending downwardly from shelf 24 and a lowermost, semi-cylindrical opening 28 at the base of the body. A chamber 30 having an opened vertical end is formed in the body 18 below the shelf 24 as best seen in FIG. 3. The body 18 also has a stepped vertical bore 32 formed therein astride recess 22 which communicates with chamber 30. Additionally, the body has a pneumatic elbow fitting 33 secured thereto and communicating with bore 32; a pneumatic line 33a is coupled to the fitting 33.

The door 20 also has an upper recess 34 with a lower shelf 36, together with a downwardly extending semi-cylindrical opening 38 and a smaller semi-cylindrical opening 40 at the base of the door. A backing surface 41 is also a part of door 20 (FIG. 1) and is important for purposes to be described. As illustrated in FIG. 3, when the door 20 is closed against body 18, the recesses 22, 34 shelves 24, 36, and openings 26, 38 and 28, 40 come in to adjacency. A vertical observation slot 41a is formed in door 20 and extends from the upper margin of the door downwardly to about the level of shelf 36. A latch screw 42 with a head 44 is shiftably mounted in door 20 and is receivable within a corresponding latch opening 46 formed in body 18. This way, the door 20, when closed, may be locked in position relative to main body 18.

The reservoir 14 is in the form of an elongated, normally upright syringe 48 having a tubular reservoir body 50 adapted to hold a viscous, flowable material 52. The body 50 is equipped with a cup-shaped pneumatic piston 54 which sits atop material 52 and is slidable within the reservoir body. The piston 54 is moveable under the influence of positive pneumatic pressure. To this end, the reservoir body 50 has an upper cap 56 presenting an upwardly projecting tubular nipple 58 which presents an internal passageway 60 communicating with the upper surface of piston 54 remote from material 52. The cap 56 is sealed to the upper end of body 50 by an O-ring 62. As depicted in FIG. 2, the nipple 58 is adapted to receive a pneumatic fitting 64 coupled to a pneumatic hose 66. The lower end of syringe 48 includes a tubular connection fitting 68 which receives the upper end of an annular filter 70. As best seen in FIG. 3, the fitting 68 includes an inner tubular segment 72 adapted to receive the upper end of filter 70 and communicating with the interior of body 50, with a surrounding, coaxial outer tubular segment 74. The filter 70 has a radially enlarged section 76 which rests atop the adjacent shelves 24, 36 and presents a stepped, tubular lower section 78.

An elongated, synthetic resin, deformable outlet tube 80 is secured to the lower section 78 of filter 70. As illustrated in FIG. 3, the tube 80 extends downwardly, passing through the cylindrical opening defined by the mated openings 28, 40, and terminates with an outlet end 82 below body 18 and/or 20.

The flow-controlling assembly 16 includes a pinch element, here in the form of a roller 84, which is adapted to engage the deformable outlet tube 80 for controlling flow of material 52 from the syringe 48. The roller 84 is in turn supported by two bearings 83 on a pneumatically operated linkage assembly 86. In detail, the assembly 86 includes a lower pivot arm 88 (see FIG. 6) having a bifurcated outer end 90 with a roller pin 92 supporting the roller 84. The arm 88 has a bore 94 in the end thereof remote from roller 84, as well as an elongated cross bore 96. A coil spring 98 is located within bore 94, and is held therein by means of a plunger 100 and shoulder screw 102 passing through bore 96 and having washers 104 mounted thereon.

Figure 5:
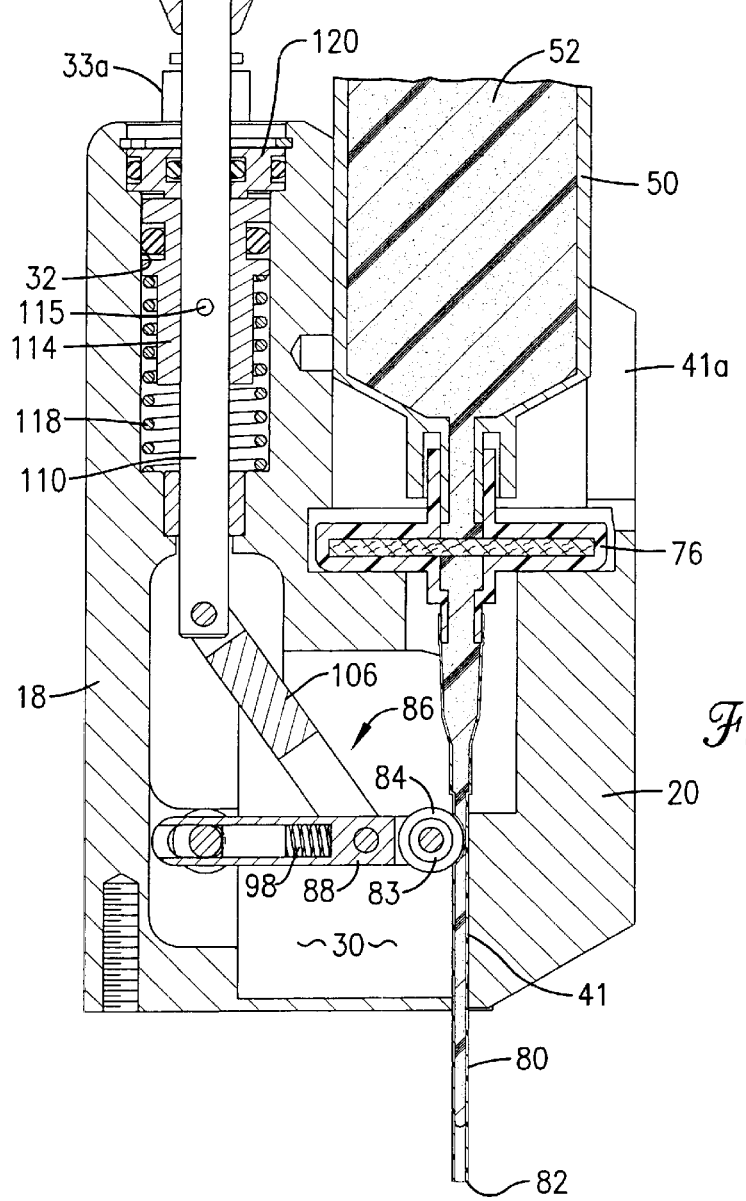
FIG. 5 is a fragmentary vertical sectional view illustrating the dispenser in its flow-preventing position and with a negative pressure created at the syringe outlet.

The linkage assembly 86 also has a cylinder link 106 which is pivotally secured to arm 88 adjacent the outer end thereof, by means of pin 108. The upper end of link 106 is pivotally secured to the lower end of piston rod 110 via pin 112. As seen in FIG. 5, the piston rod 110 is secured to pneumatic piston 114 by roll pin 115 and is vertically moveable within stepped bore 32 of housing body 18. As best seen in FIG. 3, the piston 114 is equipped with an O-ring seal 116, and return spring 118. The rod 110 extends upwardly from piston 114 through a pneumatic seal cap 120. The seal cap 120 has inner and outer O-ring seals 122, 124 as well as retaining ring 126. The rod 110 has an uppermost knob 128 secured thereto above seal cap 120. The pneumatic fitting 33 of housing body 18 communicates with bore 32 above piston 114.

In the use of dispenser 10 with the lines 33a and 66 in place, door 20 is first opened as illustrated in FIG. 1, by unfastening screw 42, and an assembled syringe 48 is positioned within housing door 20 with the lower surface of filter 70 resting on shelf 36. The knob 128 is then depressed fully to place the flow controlling assembly 16 in its open position. Door 20 (with the syringe 48 installed) is then closed against body 18 and fastened with screw 42. Upon fastening door 20 to body 18, knob 128 is released, thus closing the assembly 16 and pinching tube 80 between roller 84 and door surface 41. The initial step of depressing and then releasing knob 128 effectively seats the tube 80 and insures a positive pinch closure when the assembly 16 is in its flow-blocking position.

In the rest position or off state of dispenser 10 as depicted in FIG. 5, positive pressure is continually delivered via hose 66 to syringe body 50 and particularly against the upper face of syringe piston 54. When it is desired to dispense a selected quantity of material 52 from the dispenser 10, positive pressure air from line 33a is delivered into stepped bore 32 above piston 114. This causes downward movement of the piston 114 and piston rod 110 which in turn causes pivot arm 88 and roller 84 to pivot downwardly so that the roller 84 disengages with the adjacent outlet tube 80. It will be appreciated that such downward movement is against the bias piston spring 118. At this time the pressurized air delivered via hose 66 to syringe body 50, and particularly against the upper face of syringe piston 54 causes an even flow of the material 52 from outlet end 82 of tube 80 as depicted in FIG. 3. When the desired quantity of material has been dispensed, the positive pressure delivered through line 33a is relieved, and the bias piston spring 118 causes upward movement of piston 114 and piston rod 110 which in turn causes pivot arm 88 and roller 84 to pivot upwardly so that the roller 84 comes into engagement with the adjacent outlet tube 80, as illustrated in FIG. 4; at the same time, air within bore 32 and above piston 114 is exhausted through fitting 33 and line 33a. As the upward pivoting movement of the arm 88 and roller 84 continues, the roller first engages and deforms the tube 80 (with the opposing surface 41 of the door 20 serving as a backing for the tube) to first restrict and then completely shut off flow of material 52. However, still further movement of the roller 84 upwardly along the length of the tube 80 to the fully closed position depicted in FIG. 5 generates a small suction force within the tube 80 below the roller 84, and particularly at outlet end 82. This suction force draws the material 52 within the lower end of the tube 80 upwardly from the end 82 so that such material is fully within the confines of the tube 80. This eliminates any droplet of material depending from the outlet end 82, which would be subject to air drying. It will also be seen that the spring 98 assumes a resilient closure of the tube 80.

Of course, when it is desired to again dispense material, positive pressure air from line 33a is delivered into stepped bore 32 above piston 114 causing piston 114 and rod 110 to move downwardly, thereby pivoting the arm 88 and roller 84 away from tube 80. The positive pressure that is constantly applied via line 66 against upper face of syringe piston 54 forces material 52 from the outlet end 82. It will be appreciated that the link 88, plunger 100, spring 98 and pivotal screw 102 create a self-adjusting resilient, spring-biased pinch mechanism. As motive force from 110 acts on flow controlling assembly 16, links 106 and 88 continually adjust radially about pivotal screw 102 by compression of spring 98. This radial motion serves as a "no-wedge" system and eliminates binding. This "no-wedge" system also automatically adjusts to varying tubing sizes and thicknesses. Resilient compressive forces applied by roller 84 can also be adjusted by changing spring 98 to lesser or greater values to accommodate an even wider range of tubing geometries. This "no-wedge" system also reduces wear and undue stress on tube 80, which increases tube life. A further advantage of the hinged door design of dispenser 10 is the method of front/side loading of reservoir 14. This method of loading and unloading (as opposed to straight through or top loading of the reservoir 14) is the elimination of contamination of the internal mechanism by tube 80 during loading and unloading. This contamination is primarily due to material present in tube 80 which is not contained therein by flow controlling assembly 16. This increases the reliability and uptime of the dispenser 10. Also, the manually operated knob 128 serves as a purging mechanism for removing air from the syringe and as a means of manually overriding the dispenser controller.

While a pneumatically operated linkage assembly 86 is presently preferred, the invention is not so limited. For example, and referring to FIGS. 7a and 7b, a mechanical linkage assembly 130 may be provided for supporting a tube-deforming roller 132. In this instance, the assembly 130 is made up of two linkage bars 134 and 136. In FIG. 7a, the roller 132 is in its retracted, flow-permitting position. When it is desired to stop fluid flow in accordance with the invention, an upwardly directed force is imparted to linkage bar 134, resulting in pivotal movement of the roller 132 so that the roller first engages and deforms the tube 80 and then, through continued upward movement, generates the desirable suction force within the tube 80 below the roller. In this embodiment, a resilient backing block 138 is positioned within door 20 behind the tube 80 so that the pinch closure effected by the assembly 130 is resiliently maintained.

FIGS. 8a and 8b illustrates another type of mechanical linkage 144. In this case, the assembly includes a leaf spring 146 pivotally supporting a pivot arm 148, the latter having a roller 150 at its outboard end. An intermediate linkage bar 152 is pivotally coupled to the arm 148 intermediate its ends. In FIG. 8a, the roller 150 is in the flow-permitted position; when an upwardly directed force is imparted to bar 152 (FIG. 8b) the arm 148 is pivoted upwardly against the bias of the leaf spring 146 until the roller 150 stops flow of material through the tube 80 and creates the suction force at outlet end 82. Again, provision of the leaf spring 146 yields a resilient closure of the tube 80.

A final illustrative embodiment is shown in FIGS. 9a and 9b. Here, the linkage assembly 154 includes a dogleg link 156 supporting a roller 158. The link 156 has a spring link 160 of inverted L-shaped configuration pivotally secured thereto. The link 160 has a rearwardly extending arm 162, with a coil spring 164 located between the arm 162 and the end of dogleg link 156 remote from roller 158. In the flow-permitting position of FIG. 9a, the remote end of dogleg link 156 abuts a stationary cross pin 166. However, when it is desired to terminate flow through the tube 80, an upwardly directed force is imparted to link 160 (FIG. 9b) thereby moving the entire assembly 154 away from cross pin 166. Accordingly, spring 164 acts to pivot dogleg link 156 and roller 158 toward and into engagement with outlet tube 80. Again, this causes termination of flow through the tube 80 and also, by virtue of continued upward movement of roller 158 along the length of tube 80, generation of the desired suction force below the roller, with a resilient closure afforded by the spring 164.

The Embodiment of FIGS. 10–14

FIGS. 10–14 illustrate another dispenser embodiment 170 in accordance with the invention, including a number of features designed to enhance the performance of the dispenser. However, many of the components in the dispenser 170 are common to those of previously described dispenser 10, and therefore the same reference numerals will be used for such common components, and the latter will be described only as necessary to provide a full understanding of the dispenser 170.

Generally speaking, the features present in dispenser 170 which are in addition to the construction of dispenser 10, are provision of a bypass assembly 172 designed to prevent dispensing of material in the event that door 20 is open; flow control valve 174 serving to control the rate of movement of roller 84 during travel against and along the length of outlet tube 80 when the assembly 16 is moved to the flow-blocking position thereof, an enlarged, generally V-shaped guide 176 at the base of housing body 18; and a spring-loaded lock 178 for selectively holding the assembly 16 in its flow-permitting position.

In more detail, the bypass assembly 172 is designed to prevent accidental dispensing of material if the door 20 of housing 12 is inadvertently opened. The assembly 172 includes a bypass fitting 180 mounted on the sidewall of housing body 18 and having an inlet port 182, an outlet port 184 and a diversion port 186. A pneumatic hose 66a is coupled to inlet port 182, whereas hose 66 extends from outlet port 184 to nipple 58. The diversion port 186 is in communication with a bypass opening 188 formed in the side margin of housing body 18. The door 20 is equipped with a resilient seal 190 which is oriented so that, when the door 20 is fully closed and locked in place, the seal 190 fully seals and closes opening 188.

Thus, the normal dispensing operation of dispenser 170 proceeds as discussed above in connection with dispenser 10, i.e, pressurized air passes through line 66a, bypass assembly 172 and line 66 so as to pressurize reservoir piston 54. However, if the door 20 becomes dislodged, the port 188 is opened to the atmosphere, and therefore pressurized air from line 66a passes through the fitting 180 and diversion port 186 for venting to the atmosphere through opening 188. This of course immediately relieves the pressure against 54, thus stopping flow of the viscous material within the reservoir 14.

The flow control valve 175 includes a conventional needle or metering valve together with a check valve in parallel therewith. These valves, which are themselves conventional, are mounted within a valve unit 192 affixed to main housing body 18 upstream of the fitting 33 and conduit 33a. The check valve within unit 192 permits unrestricted flow of pressurized air into chamber 32 above piston 114. Hence, no restriction is placed upon the quick actuation of the assembly 16 in order to shift roller 84 to the flow-permitting position illustrated in FIG. 12. On the other hand, the parallel metering valve within the unit 192 allows selective metering of exhaust air during the closing operation of assembly 16.

The significance of flow control valve 174 is that it permits controlled alteration of the suckback operation of assembly 16, so as to accommodate fluids of varying viscosities. That is, high viscosity fluids tend to adhere to the inner walls of outlet tube 80 to a greater extent than lower viscosity fluids. Unless steps are taken to control the suckback operation, a too-rapid closing operation of the assembly 16 can leave fluid within the tube 80. This fluid would eventually collect at the tube 80 end and possibly dry if long periods of time are needed between dispensing. This fluid could dry and effectively plug tube 80; Also, an air bubble is formed between the main fluid body and the fluid that has collected at the end of tube 80. This bubble, when dispensed, will stay suspended in the dispense fluid and cause streaks and voids after processing. However, with the adjustable suckback operation afforded by the use of the adjustable metering valve, The operator may retard the suckback closing sequence of assembly 16 so as to insure that none of the valuable fluid is wasted.

Figure 10:
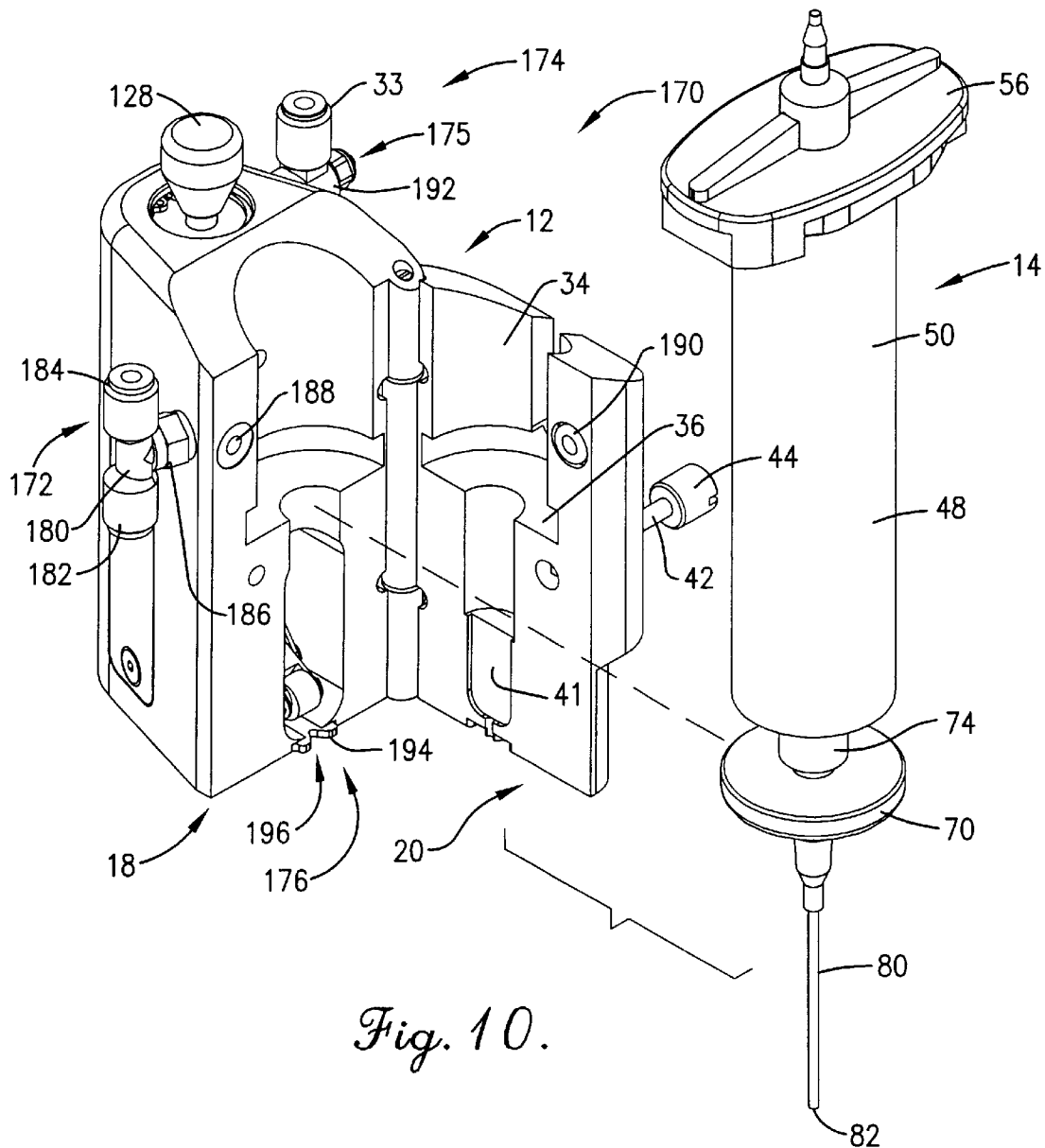
FIG. 10 is a perspective, exploded view of another dispenser housing and replaceable syringe assembly in accordance with the invention.
Figure 11:
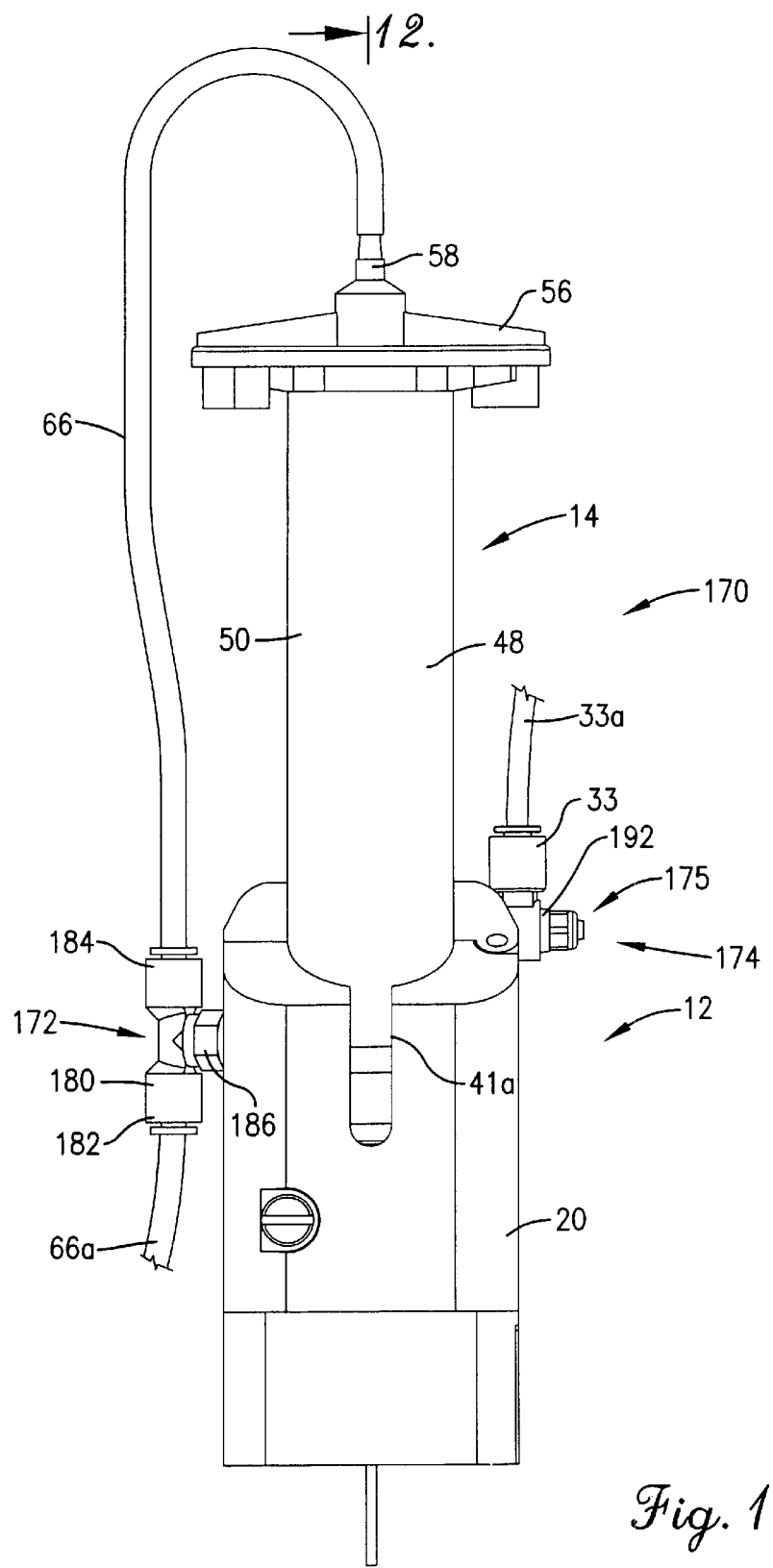
FIG. 11 is a front elevational view of the device depicted in FIG. 10.

The enlarged guide 176 is used in lieu of the small opening 28 of dispenser 10. As best illustrated in FIG. 10, the guide 176 is in the form of a metallic clip 194 presenting a wide, generally V-shaped mouth 196. This insures that the tube 80 is properly aligned upon closure of door 20, thereby preventing the tube from being pinched.

The lock 178 is in the form of an elongated locking pin 198 shiftably housed within a bore 200 formed in the wall of housing body 18. The pin 198 includes an enlarged head 202 as well as an elongated shank 204 terminating in an inboard locking lug 206. The pin 198 is maintained in place by snap ring 208, and is biased to the FIG. 12 position by means of spring 210. In this embodiment, the link 110 is equipped with a pin opening 212 including a locking projection 214.

In use, when it is desired to lock the assembly 16 in its flow-permitting position, the assembly 16 is actuated as previously described so as to pivot roller 84 to the FIG. 14 position. Thereupon, the head 202 of pin 198 is depressed so that locking lug 206 comes into locking interengagement with projection 214. In this fashion, the assembly 16 is maintained in its open position. When it is desired to close the assembly 16, the knob 128 is depressed, and, as the assembly 16 is moved down, the pin 198 is shifted back to its FIG. 12 position under the influence of spring 210.

We claim:

1. A dispenser comprising:

a reservoir for holding a viscous material to be dispensed;

a deformable outlet tube operatively coupled with said reservoir and presenting an outlet end;

a flow controlling assembly including an elongated pivot arm presenting a pair of opposed ends, one of said ends supporting a tube-engaging element and the other of said ends being pivotally supported, a spring carried by said pivot arm and outwardly biasing said tube-engaging element, said flow controlling assembly further including an actuator pivotally coupled with said pivot arm and operable to selectively move said element from a flow-permitting position into material flow-blocking, tube-deforming engagement with said tube, and to move said element along said tube in a direction away from said outlet end to create a suction drawing said material at said outlet end into said tube, said tube-engaging element resiliently engaging said tube when said element is in the material flow-blocking position thereof.

2. The dispenser of claim 1, said reservoir comprising a syringe body including a shiftable piston disposed above the level of material within the body, said piston being moveable under the influence of pneumatic pressure applied against the face of the piston remote from said material.

3. The dispenser of claim 1, said actuator comprising a mechanical linkage.

4. The dispenser of claim 1, said dispenser including a housing supporting said flow controlling assembly, said reservoir and tube being received within said housing.

5. The dispenser of claim 1, including a backing member in opposed relationship to said element with said tube disposed between the element and backing member, said backing member being resilient and deformable when said element is moved to said flow-blocking position thereof.

6. The dispenser of claim 1, said actuator including a terminal link, said terminal link being pivotally coupled with said pivot arm intermediate the ends of the latter.

7. The dispenser of claim 1, said actuator operative to repeatedly move said element between said flow-permitting position and said engagement with said tube.

8. The dispenser of claim 1, said element comprising a tube-engaging roller.

9. The dispenser of claim 1, said actuator comprising a linkage operatively supporting said element, said linkage being selectively shiftable for moving said element into said engagement into said tube, and to move the element along the tube for creating said suction.

10. The dispenser of claim 9, said linkage being pneumatically actuatable.

11. The dispenser of claim 1, said actuator operable to move said pivot arm and element along an arcuate path.

12. A dispenser comprising:
a reservoir for holding a viscous material to be dispensed;
a deformable outlet tube operatively coupled with said reservoir and presenting an outlet end;
a flow controlling assembly including an elongated pivot arm presenting a pair of opposed ends, one of said ends supporting a tube-engaging element, a spring carried by said pivot arm and outwardly biasing said tube engaging element, and an actuator coupled with said element in order to selectively move the element from a flow-permitting position spaced from said tube into material flow-blocking, tube-deforming engagement with said tube, and to move the element along the tube in a direction away from said outlet end to create a suction drawing material at said outlet end into the tube,
said assembly operable to resiliently engage said tube when said element is in the material flow-blocking position thereof; and
a housing supporting said flow controlling assembly, said reservoir and tube being received within said housing.

13. A dispenser comprising:
a reservoir for holding a viscous material to be dispensed;
a deformable outlet tube operatively coupled with said reservoir and presenting an outlet end;
a flow controlling assembly including a tube-engaging element and an actuator coupled with said element in order to selectively move the element from a flow-permitting position spaced from said tube into material flow-blocking, tube-deforming engagement with said tube, and to move the element along the tube in a direction away from said outlet end to create a suction drawing material at said outlet end into the tube,
said assembly operable to resiliently engage said tube when said element is in the material flow-blocking position thereof; and
a backing member in opposed relationship to said element when said tube is disposed between the element and the backing member, said backing member being resilient and deformable when said element is moved to said flow-blocking position therein.

14. A dispenser comprising:
a reservoir for holding a viscous material to be dispensed;
a deformable outlet tube operably coupled with said reservoir and presenting an outlet end;
a housing supporting said reservoir and having a selectively openable door permitting access to said reservoir,
said reservoir including a fluid pressure-actuated shiftable piston oriented to move said material within the reservoir toward and out said outlet end, and a fluid conduit for selective passage of fluid to said piston for said shifting thereof;
a bypass assembly operably coupled with said conduit so that, when said door is open, said fluid is diverted and prevented from passing to said piston; and
a flow controlling assembly including a tube-engaging element and an actuator coupled with said element in order to selectively move the element from a flow-permitting position adjacent said tube into material flow-blocking, tube-deforming engagement with the tube.

15. The dispenser of claim 14, said bypass assembly including a bypass opening in said housing and a bypass opening seal carried by said door, said seal oriented to close said bypass opening when the door is closed, and permitting passage of fluid through said bypass opening when said door is open.

16. The dispenser of claim 14, said actuator operative to repeatedly move said element between said flow-permitting position and said engagement with said tube.

17. The dispenser of claim 14, said element comprising a tube-engaging roller.

18. The dispenser of claim 14, said actuator comprising a linkage operatively supporting said element, said linkage being selectively shiftable for moving said element into said engagement into said tube, and to move the element along the tube for creating said suction.

19. The dispenser of claim 18, said linkage being pneumatically actuatable.

20. The dispenser of claim 14, said actuator operable to move said element along an arcuate path.

21. The dispenser of claim 14, said element being spring-biased toward said tube.

22. The dispenser of claim 14, said reservoir comprising a syringe body including a shiftable piston disposed above the level of material within the body, said piston being moveable under the influence of pneumatic pressure applied against the face of the piston remote from said material.

23. The dispenser of claim 14, said actuator comprising a mechanical linkage.

24. The dispenser of claim 14, said housing supporting said flow controlling assembly, said reservoir and tube being received within said housing.

25. The dispenser of claim 14, including a spring biasing said element against said tube when the element is in said flow-blocking position thereof.

26. The dispenser of claim 14, including a backing member in opposed relationship to said element with said tube disposed between the element and backing member, said backing member being resilient and deformable when said element is moved to said flow-blocking position thereof.

27. The dispenser of claim 14, said actuator operable to move the element along the tube in a direction away from said outlet end to create a suction drawing material at said outlet end into the tube.

28. A dispenser comprising:

a reservoir for holding a viscous material to be dispensed;

a deformable outlet tube operatively coupled with said reservoir and presenting an outlet end;

a flow controlling assembly including a tube-engaging element and an actuator coupled with said element in order to selectively move the element from a flow-permitting position adjacent said tube into material flow-blocking, tube-deforming engagement with said tube, and to move the element along the tube in a direction away from said outlet end to create a suction drawing material at said outlet end into the tube, said assembly operable to resiliently engage said tube when said element is in the material flow-blocking position thereof, said flow-controlling assembly further including a chamber, a material piston within the chamber and operatively coupled with said actuator, and a fluid circuit arranged so that, when fluid pressure is applied against said piston, said element is moved from said flow-blocking position to said flow-permitting position, said fluid circuit permitting exhaust of said fluid from said chamber when said element is moved along the length of said tube to create said suction, said flow-controlling assembly further including a flow control valve operable to adjustably meter said exhaust of said fluid from said chamber in order to control the rate of movement of said element along the length of said tube to create said suction.

29. The dispenser of claim 28, said flow control valve comprising a check valve in parallel with an adjustable metering valve, said check valve permitting substantially unrestricted flow of said fluid to said piston during movement of the element from said flow-blocking to said flow-permitting positions, said metering valve limiting said exhaust of said fluid from said chamber.

30. The dispenser of claim 28, said actuator operative to repeatedly move said element between said flow-permitting position and said engagement with said tube.

31. The dispenser of claim 28, said element comprising a tube-engaging roller.

32. The dispenser of claim 28, said actuator comprising a linkage operatively supporting said element, said linkage being selectively shiftable for moving said element into said engagement into said tube, and to move the element along the tube for creating said suction.

33. The dispenser of claim 32, said linkage being pneumatically actuatable.

34. The dispenser of claim 28, said actuator operable to move said element along an arcuate path.

35. The dispenser of claim 28, said element being spring-biased toward said tube.

36. The dispenser of claim 28, said reservoir comprising a syringe body including a positioning piston disposed above the level of material within the body, said piston being moveable under the influence of pneumatic pressure applied against the face of the piston remote from said material.

37. The dispenser of claim 28, said actuator comprising a mechanical linkage.

38. The dispenser of claim 28, said dispenser including a housing supporting said flow controlling assembly, said reservoir and tube being received within said housing.

39. The dispenser of claim 28, including a spring biasing said element against said tube when the element is in said flow-blocking position thereof.

40. The dispenser of claim 28, including a backing member in opposed relationship to said element with said tube disposed between the element and backing member, said backing member being resilient and deformable when said element is moved to said flow-blocking position thereof.

41. A dispenser comprising:

a reservoir for holding a viscous material to be dispensed;

a deformable outlet tube operatively coupled with said reservoir and presenting an outlet end;

a flow controlling assembly including a tube-engaging element and an actuator coupled with said element in order to selectively move the element from a flow-permitting position spaced from said tube into material flow-blocking, tube-deforming engagement with said tube, and to move the element along the tube in a direction away from said outlet end to create a suction drawing material at said outlet end into the tube; and a backing member in opposed relationship to said element with said tube disposed between the element and backing member, said backing member being resilient and deformable when said element is moved to said flow-blocking position thereof, said assembly operable to resiliently engage said tube when said element is in the material flow-blocking position thereof.

42. The dispenser of claim 41, said actuator operative to repeatedly move said element between said flow-permitting position and said engagement with said tube.

43. The dispenser of claim 41, said element comprising a tube-engaging roller.

44. The dispenser of claim 41, said actuator comprising a linkage operatively supporting said element, said linkage being selectively shiftable for moving said element into said engagement into said tube, and to move the element along the tube for creating said suction.

45. The dispenser of claim 44, said linkage being pneumatically actuatable.

46. The dispenser of claim 41, said actuator operable to move said element along an arcuate path.

47. The dispenser of claim 41, said reservoir comprising, a syringe body including a shiftable piston disposed above the level of material within the body, said piston being moveable under the influence of pneumatic pressure applied against the face of the piston remote from said material.

48. The dispenser of claim 41, said actuator comprising a mechanical linkage.

49. The dispenser of claim 41, said dispenser including a housing supporting said flow controlling assembly, said reservoir and tube being received within said housing.

50. The dispenser a spring biasing said element against said tube when said element is in said flow-blocking position thereof.

* * * * *

UNITED STATES PATENT AND TRADEMARK OFFICE
CERTIFICATE OF CORRECTION

PATENT NO. : 6,598,765 B2
DATED : July 29, 2003
INVENTOR(S) : Russell T. Pagel, Jeremy W. McCutcheon and Jeffrey L. Kohne It is certified that error appears in the above-identified patent and that said Letters Patent is hereby corrected as shown below:

Drawings,
Fig. 15 should be added as drawing sheet 9.

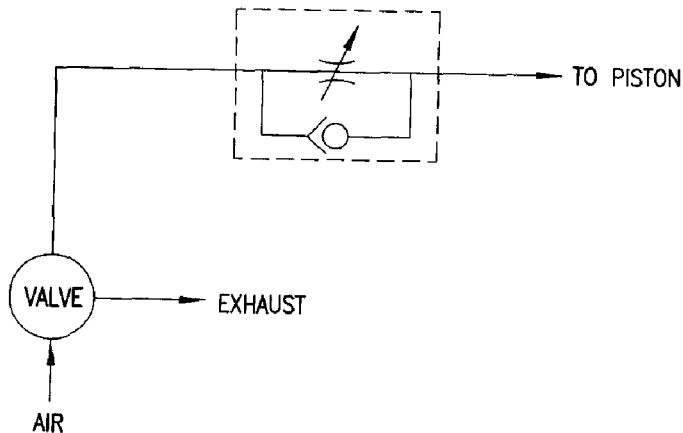

*Fig. 15.*

Signed and Sealed this

Fifth Day of April, 2005

JON W. DUDAS
*Director of the United States Patent and Trademark Office*